(12) United States Patent
Bourdelle et al.

(10) Patent No.: US 7,833,877 B2
(45) Date of Patent: Nov. 16, 2010

(54) METHOD FOR PRODUCING A SEMICONDUCTOR SUBSTRATE

(75) Inventors: Konstantin Bourdelle, Crolles (FR); Carlos Mazure, Bernin (FR)

(73) Assignee: S.O.I.Tec Silicon on Insulator Technologies, Bernin (FR)

(*) Notice: Subject to any disclaimer, the term of this patent is extended or adjusted under 35 U.S.C. 154(b) by 483 days.

(21) Appl. No.: 11/877,456

(22) Filed: Oct. 23, 2007

(65) Prior Publication Data

US 2008/0102601 A1     May 1, 2008

(30) Foreign Application Priority Data

Oct. 27, 2006    (FR) ................................. 06 09466

(51) Int. Cl.
*H01L 21/30* (2006.01)
(52) U.S. Cl. ..................................... 438/455; 438/458
(58) Field of Classification Search .............. 438/455, 438/458
See application file for complete search history.

(56) References Cited

U.S. PATENT DOCUMENTS

| | | | |
|---|---|---|---|
| 6,103,599 A | 8/2000 | Henley et al. ............... 438/459 |
| 6,146,979 A * | 11/2000 | Henley et al. ............... 438/458 |
| 6,251,754 B1 | 6/2001 | Ohshima et al. ............. 438/506 |
| 6,903,032 B2 | 6/2005 | Maleville et al. ............ 438/796 |
| 7,001,826 B2 * | 2/2006 | Akatsu et al. ............... 438/458 |
| 2004/0009626 A1 * | 1/2004 | Tweet et al. .................... 438/93 |
| 2006/0099779 A1 | 5/2006 | Cayrefourcq et al. ....... 438/486 |
| 2006/0154429 A1 * | 7/2006 | de Souza et al. ............ 438/305 |
| 2008/0079003 A1 * | 4/2008 | Shaheen et al. ............... 257/64 |

FOREIGN PATENT DOCUMENTS

| | | |
|---|---|---|
| FR | 2 847 076 A1 | 5/2004 |
| WO | WO 2004/042779 A2 | 5/2004 |
| WO | WO 2006/037783 A1 | 4/2006 |

OTHER PUBLICATIONS

Search report, French application No. 06 09466 dated May 4, 2007.
G. Celler, Frontiers of Silicon-on-Insulator, *Journal of Applied Physics*, vol. 93, No. 9, pp. 4955-4978 (2003).

* cited by examiner

*Primary Examiner*—David Vu
*Assistant Examiner*—Brandon Fox
(74) *Attorney, Agent, or Firm*—Winston & Strawn LLP

(57) ABSTRACT

This invention relates to a method for producing a substrate by transferring a layer of a material from a donor substrate to a support substrate, and then by removing a part of the layer of material to form the thin layer. The step of removing a part of the layer of material to form the thin layer comprises forming an amorphous layer in a part of the thin layer, and then recrystallizing the amorphous layer.

20 Claims, 2 Drawing Sheets

METHOD FOR PRODUCING A SEMICONDUCTOR SUBSTRATE

BACKGROUND OF THE INVENTION

The present invention relates to a method for producing a substrate such as a semiconductor on insulator (SeOI) substrate and the substrates obtained according to the method.

One field of application of the invention is that of the methods for producing such SeOI structures, such as Silicon On Insulator (SOI) structures, these structures acting as substrates for producing components for electronics, optics or optoelectronics. Such SeOI structures comprise an insulating layer inserted between a thin layer of semiconductor material and a support substrate. These SeOI structures are generally obtained by transfer of a layer of semiconductor material onto a support substrate from a donor substrate and by then removing a part of the layer of semiconductor material to form the thin layer.

The step of removing a part of the layer of semiconductor material to form the thin layer can be performed by different methods. This removal step is preferably obtained by means of the well known SMARTCUT(®) method. Further details concerning this SMARTCUT(®) method, which is known per se to the skilled person, can be found, for example, in the article by G. Celler, Frontiers of Silicon-on-Insulator, Journal of Applied Physics, Vol. 93, no. 9, May 1, 2003, pages 4955-4978).

Producing a SeOI structure using the Smart Cut(®) method in particular requires a finishing step after formation of the thin layer in order to eliminate the residual roughness of the upper surface of the thin layer. Indeed, when the thin layer is formed, thermal and mechanical treatment leading to detachment of a part of the layer of semiconductor material result in a residual roughness of about 40 to 100 A RMS on the upper surface of the thin layer and formation of a damaged zone over a thickness of a few hundred to a few thousand Angstroms. In this damaged zone, the crystalline quality has been disturbed and damaged by the ion implantation step, close to the fracture plane.

This finishing step generally consists in a light abrasion, polishing, a sacrificial oxidation step on the upper surface of the thin layer, or a combination of these steps to eliminate this damaged zone and restore a surface quality, i.e. a satisfactory roughness. U.S. Pat. No. 6,903,032 describes one such finishing step which comprises a first abrasion step, preferably by sacrificial oxidation, followed by short annealing of the substrate.

Annealing of the substrate at high temperatures cannot be applied to all types of material and in particular is not usable on Germanium (Ge) substrates, or on all types of composite materials or heterostructures such as silicon on a quartz wafer. Performing annealing at high temperatures does in fact result in thermal expansion differences of the different materials constituting the substrate. These thermal expansion differences may lead to breaking of the substrate.

U.S. Pat. No. 6,103,599 is also known for disclosing a method for performing finishing of the upper surface of a substrate. This method consists in implanting hydrogen species via the upper surface of the substrate to form a layer called the implanted layer and in then removing the implanted layer by any suitable means. This type of method presents the drawback of procuring an insufficient reduction of the residual roughness of the upper surface of the thin layer so that this type of method is not used commercially.

Thus, there is a need for improved SEOI structures and methods of making them.

SUMMARY OF THE INVENTION

The invention now remedies these shortcomings by providing a method for producing a semiconductor substrate such as a SEOI substrate that presents a low residual roughness of the upper surface. Also, this method is easy to implement and is relatively inexpensive.

This method generally produces the substrate by transferring a layer of a material from a donor substrate onto a support substrate, and then by removing a part of the layer of material to form the thin layer. The method is remarkable in that, after the step of removing a part of the layer of material to form the thin layer, it comprises at least the steps of forming an amorphous layer in a part of the thin layer, and then recrystallizing the amorphous layer in order to reduce or eliminate residual roughness on the thin layer.

Advantageously, prior to the formation of the amorphous layer in the thin layer, the method comprises a step of reducing surface roughness on the thin layer. This step includes at least the steps of formation of a sacrificial oxidation layer on the thin layer, and then of removing the oxidation layer to reduce roughness of the layer.

Accessorily, the substrate comprises an insulating layer located between the thin layer of semiconductor material and the support substrate.

BRIEF DESCRIPTION OF THE DRAWINGS

Other advantages and features will become more clearly apparent from the following description of several alternative embodiments, given as non-restrictive examples only, of the method for producing a semiconductor on insulator substrate according to the invention, with reference to the appended Figures in which.

DETAILED DESCRIPTION OF THE PREFERRED EMBODIMENTS

Examples of the present methods for producing a semiconductor on insulator substrate according to the invention will be described hereafter. It is however quite obvious that the method according to the invention can be applied for producing a semiconductor substrate without an insulating layer or a substrate obtained in any semiconductor material that is usually used in microelectronics, optoelectronics, or micromechanics etc. applications, such as sapphire for example, without departing from the scope of the invention.

Figure 1:
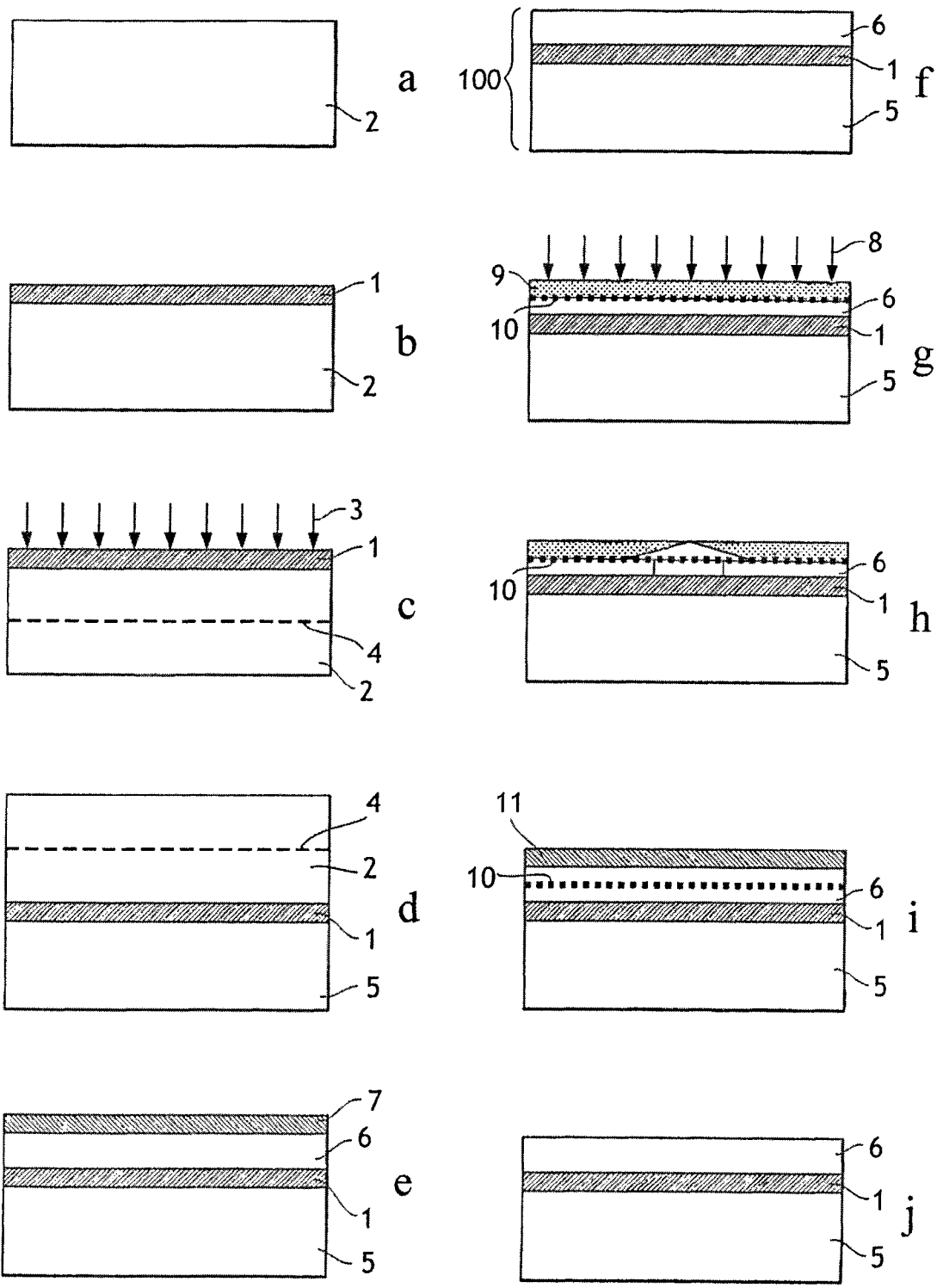
FIG. 1a-1j is a schematic representation of the main steps of one embodiment of a substrate according to the invention.

Embodiment With Transfer From A Donor Substrate With A Zone Fragilized By Implantation With reference to FIG. 1, according to a preferred embodiment of the invention, the method comprises a formation step of an insulating layer 1(FIG. 1b) on the upper surface of a donor substrate 2 (FIG. 1a) obtained in a semiconductor material. Formation of the insulating layer 1 is for example obtained by oxidation of the upper surface of the donor substrate 2 in a manner well known to the person skilled in the art.

The donor substrate presents for example a general disk shape extending in a horizontal direction. Moreover, hereafter in the text, what is meant by the upper surface, i.e. the top, of the substrate 2 is the surface that receives the species implantation or implantations. The donor substrate 2 is a semiconductor material such as silicon. Furthermore, the insulating layer 1 is preferably an oxide layer.

With reference to FIG. 1c, ions and/or gaseous species 3 are then implanted via the upper surface of the insulating layer 1 so as to form a fragilized buried zone 4, represented by broken lines in FIG. 1c, in the donor substrate 2 according to the SMART-CUT® method as described in the Celler article mentioned herein. This fragilized zone 4 is formed in the donor substrate 2 under the insulating layer 1, and, as will be seen further on, enables a part of the donor substrate 2 to be detached to form the thin layer of the final substrate.

This implantation step preferably implements implantation of hydrogen only or of helium only or co-implantation of at least two different atomic species, preferably helium and hydrogen The implantation parameters to form the fragilized zone 4 can be selected in such a way that the fragilized zone is located in the donor substrate 2 just below the insulating layer 1, for example from a few thousand Angstroms to a few microns under the surface of the donor substrate 2.

With reference to FIG. 1d, a support substrate 5 is then bonded to the upper surface of the insulating layer 1 by any suitable means. Hereafter in the text, what is meant by bonding is placing the support substrate 5 in close contact with the insulating layer 1 to assemble same. This bonding can be achieved by directly placing a surface of the support substrate 5 made of semiconductor material such as silicon in contact with the upper surface of the insulating layer.

Additionally, when bonding of the support substrate 5 to the upper layer of the insulating layer 1 is performed, the method according to the invention preferably comprises a plasma activation step to improve bonding and enable transfer at lower temperature if necessary.

With reference to FIG. 1d, a part of the donor substrate 2 is detached at the level of the fragilized zone 4 according to the SMART-CUT® method, by annealing and/or with application of strains. The substrate thus obtained, with reference to FIG. 1e, comprises a support substrate 5, an insulating layer 1 and a thin layer 6

Optionally, the thin layer 6 is superficially oxidized so as to form a sacrificial oxidation layer 7, and the sacrificial oxidation layer 7 is then removed by any suitable means so as to both reduce the roughness of the upper surface of the thin layer 6 and to eliminate a part of the damaged zone which formed at the same time as the thin layer 6 was formed. The sacrificial oxidation layer preferably has a thickness smaller than or equal to 250 Angstrom.

Removal of the sacrificial oxidation layer 7 is advantageously obtained by immersing the sacrificial oxidation layer 7 in a hydrofluoric acid chemical bath called HF chemical bath.

Alternatively, or as a complement, removal of the sacrificial oxidation layer 7 may for example be achieved by abrasion of the layer by means of a Chemical Mechanical Planarization (CMP) method, until the thin layer 6 constitutes the upper layer of an intermediate structure 100 (FIG. 1f).

An intermediate structure 100 formed by an insulating layer 1 located between a top thin layer 6 of semiconductor material and a bottom support substrate 5 is obtained with reference to FIG. 1f. The upper surface of the thin layer 6 of the intermediate structure 100 does however present a residual roughness and a zone called the damaged zone which formed at the same time as the thin layer 6 was formed, the damaged zone presenting a lower crystalline quality.

To reduce or eliminate this residual roughness and this damaged zone, the method according to the invention comprises, with reference to FIG. 1g, a step of implantation of species 8 via the top surface of the thin layer 6 so as to form a superficial amorphous layer 9 in the thin layer 6. The atomic species 8 can be chosen for example from the following list: Si, Ge, Ar and Xe etc., or any suitable atomic species known to the skilled artisan.

To obtain this amorphous layer 9, the implantation parameters are controlled in a manner well known to the person skilled in the art to obtain an amorphous layer 9 with a thickness comprised between 0.1 and 2 microns. The implantation parameters have to be controlled such that the depth of the amorphous layer 9 is smaller than the thickness of the thin layer 6 to preserve a crystalline thickness between the amorphous layer 9 and the insulating layer enabling recrystallization of the amorphous layer as will be described in detail herein. Implantation parameters can for example be chosen such that about 50 to 60% of the thickness of the thin layer 6 is made amorphous.

By recrystallization annealing, with reference to FIG. 1h, the superficial amorphous layer 9 will recrystallize from the thin layer 6 which acts as seed layer. When recrystallization annealing is performed, the roughness of the thin layer 6 is substantially reduced, for example 20 A RMS reduction of the roughness, and a thickness of material of good crystalline quality is reformed instead of and in place of the damaged zone.

This recrystallization annealing can include a low-temperature annealing performed at a temperature of between 500° and 800° C. for 3 seconds to 2 hours.

Alternatively, this annealing can be a rapid annealing, with a duration of between 30 seconds and several minutes, at a temperature comprised between 1100° and 1200° C., and conducted in a reducing atmosphere.

According to another alternative embodiment, annealing can also include an annealing step in a furnace at a temperature comprised between 1100° and 1300° C. for several hours.

According to a last alternative embodiment, this annealing can include a sacrificial oxidation step as described in U.S. Pat. No. 6,903,032, which is incorporated herein by reference to the extent necessary to understand this step.

Optionally, with reference to FIG. 1i, the method comprises a step of removing any crystalline defects 10 liable to form in the thin layer 6 when recrystallization of the amorphous layer 9 takes place at the level of the interface between the crystalline layer of the thin layer 6 and the amorphous layer 9. According to a first alternative embodiment of the step of removing the crystalline defects 10, it consists in forming a sacrificial oxidation layer 11 on the recrystallized thin layer 6 and then removing the sacrificial oxidation layer 11 down to the level of the crystalline defects 10 to eliminate the latter. Removing the sacrificial oxidation layer 11 preferably consists of chemical abrasion of the upper surface of the recrystallized thin layer down to the crystalline defects 10. According to a second alternative embodiment of the step of removing the crystalline defects, the latter consists in performing annealing at a temperature of more than 1000° C. for a few seconds to several hours.

Finally, finishing treatment of the upper surface of the thin layer 6 may be performed if required to eliminate any residual surface defects. This finishing step can consist either of annealing or of polishing of the upper surface of the thin layer 6.

Moreover, it is quite obvious that the method according to the invention may not comprise a deposition step of an insulating oxide layer 1 on the upper surface of the donor substrate 2, the support substrate 5 being bonded directly to the upper surface of the donor substrate 2.

Alternative Embodiment With Formation of A Porous Layer

Figure 2:
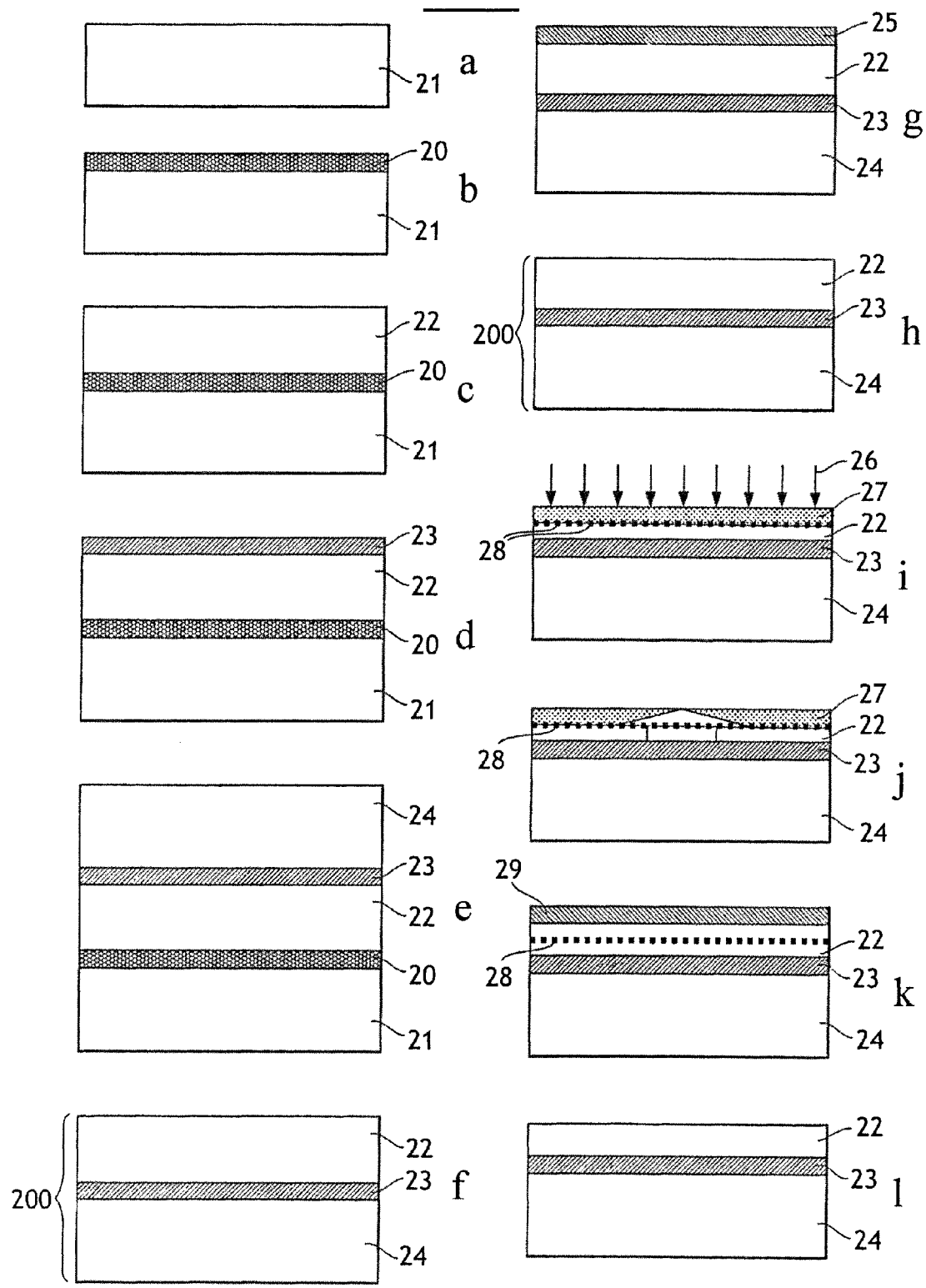
FIG. 2a-2l is a representation of the main steps of an alternative embodiment of a substrate according to the invention.

With reference to FIG. 2, according to an alternative embodiment of the invention, the method comprises a deposition step of a fragilized porous layer 20 (FIG. 2b) on a donor substrate 21 (FIG. 2a) obtained in a semiconductor material such as silicon. With reference to FIG. 2c, an upper crystalline layer called thin layer, preferably made from silicon, is deposited by epitaxy on the fragilized porous layer 21. An insulating layer 23 is then deposited on the thin layer 22, with reference to FIG. 2d. The insulating layer 23 is preferably an oxide layer. A support substrate 24 is then bonded onto the upper surface of the insulating layer 23 by any suitable means, with reference to FIG. 2e.

With reference to FIGS. 2e and 2f, the donor substrate 21 is detached at the level of the fragilized porous layer 20, by applying stresses, to obtain an intermediate structure 200 composed of an insulating layer 23 located between a top thin layer 22 of semiconductor material and a bottom support substrate 24. Optionally, with reference to FIG. 2g, a sacrificial oxidation layer 25 is formed on the thin layer 22, and the sacrificial oxidation layer 25 is then removed by any suitable means to reduce the roughness of the upper surface of the thin layer 22.

The sacrificial oxidation layer 25 is deposited on the thin layer 22 over a thickness preferably less than or equal to 250 Angstrom. Removal of the sacrificial oxidation layer 25 is advantageously obtained by immersing the sacrificial oxidation layer 25 in a HF chemical bath.

Alternatively, removal of the sacrificial oxidation layer 25 could be obtained for example by abrasion of the layer by a CMP method until the thin layer 22 forms the top layer of the intermediate structure 200 (FIG. 2h). An intermediate structure 200 formed by an insulating layer 23 located between a top thin layer 22 of semiconductor material and a bottom support substrate 24 is obtained, with reference to FIG. 2h.

The upper surface of the thin layer 22 of the intermediate structure 200 does however present a residual roughness and a zone called the damaged zone which formed at the same time as the thin layer 22 was formed, the damaged zone presenting a lower crystalline quality. To reduce or eliminate this residual roughness, the method according to the invention comprises, with reference to FIG. 2i, a step of implantation of species 26 via the upper surface of the thin layer 22 to form a superficial amorphous layer 27 in the thin layer 22. The atomic species 26 can be chosen for example from the following list: Si, Ge, Ar and Xe.

To obtain this amorphous layer 27, the implantation parameters are controlled in a manner well known to the person skilled in the art to obtain an amorphous layer with a thickness comprised between 0.1 and 2 microns. The implantation parameters have to be controlled in such a way that the depth of the amorphous layer 27 is smaller than the thickness of the thin layer 22 to preserve a crystalline thickness between the amorphous layer 27 and the insulating layer 23 enabling recrystallization of the amorphous layer, as will be explained in detail further on. Implantation parameters can for example be chosen such that about 60% of the thickness of the thin layer 22 is made amorphous. It can be observed that the superficial amorphous layer 27 can also be achieved by direct deposition of an amorphous layer on the thin layer 22.

By recrystallization annealing, with reference to FIG. 2j, the superficial amorphous layer 27 will recrystallize from the thin layer 22 which acts as seed layer. When this recrystallization annealing is performed, the roughness of the recrystallized thin layer 22 is substantially reduced. This recrystallization annealing consists of low-temperature annealing performed at a temperature comprised between 500° and 800° C. for 3 seconds to 2 hours.

Optionally, with reference to FIG. 2k, the method comprises a step of removing any crystalline defects 28 liable to form in the thin layer 22 when recrystallization of the amorphous layer 27 takes place at the level of the interface between the crystalline layer of the thin layer 22 and the amorphous layer 27. A first alternative embodiment of the step of removing the crystalline defects 28, comprises forming a sacrificial oxidation layer 29 on the recrystallized thin layer 22 and then removing the sacrificial oxidation layer 29 down to the level of the crystalline defects 28 to eliminate the latter. Removing the sacrificial oxidation layer 29 preferably includes a step of chemical abrasion of the upper surface of the recrystallized thin layer 22 down to the crystalline defects 28. A second alternative embodiment of the step of removing the crystalline defects 28 includes performing an annealing at a temperature of more than 1000° C. for a few seconds to several hours.

Finally, finishing treatment of the upper surface of the thin layer 22 may be performed if required to eliminate any residual surface defects. This finishing step can consist either of annealing or of polishing of the upper surface of the thin layer 22. Moreover, in the same way as before, the method according to the invention may not comprise a deposition step of an insulating oxide layer 23 on the thin layer 22, the support substrate 24 being bonded directly by any suitable means to the thin layer 22.

EXAMPLES

A particular non-restrictive example of an embodiment of a substrate obtained according to the invention will be described hereafter with reference to FIG. 1.

Example 1

With reference to FIG. 1, the method comprises a formation step of an insulating layer 1 (FIG. 1b) of oxide with a thickness comprised between 500 and 2000 Angstrom on the upper surface of a donor substrate 2 (FIG. 1a) made of Silicon (Si).

With reference to FIG. 1c, hydrogen is then implanted through the upper surface of the insulating layer 1 with a dose of about $5 \times 10^{16}$ at/cm$^2$ and an energy of about 200 keV so as to form a fragilized buried zone 4, represented in broken lines in FIG. 1c, in the donor substrate 2.

This fragilized zone 4 is formed in the donor substrate 2 about 2 microns below the insulating layer 1.

Then, with reference to FIG. 1d, a support substrate 5 is bonded to the upper surface of the insulating layer 1 by any suitable means. Preferably, molecular bonding is used.

With reference to FIG. 1d, a part of the donor substrate 2 is detached at the level of the fragilized zone 4 according to the SMART-CUT® method, by annealing at a temperature comprised between 300° and 600° C. for a few hours and possibly by applying mechanical strains. The substrate thus obtained, with reference to FIG. 1e, comprises a support substrate 5, an insulating layer 1 and a thin layer 6 presenting a thickness of about 1.6 µm.

After detachment, with reference to FIG. 1f, the substrate 100 presents a roughness of about 100 A RMS and a damaged zone over a thickness of about 3000 A (0.3 micron), the damaged zone having formed when the thin layer 6 was formed.

The method according to the invention comprises, with reference to FIG. 1g, a Si implantation step with a dose of about $10^{14}$ to $10^{16}$ at/cm$^2$ and an energy comprised between 50 and 250 keV, via the upper surface of the thin layer 6 to form a superficial amorphous layer 9 with a thickness comprised between 0.1 and 0.6 microns in the thin layer 6.

It can be observed that, for an implantation energy of 180 keV, the thickness of the amorphous layer 9 is about 0.4 microns By recrystallization annealing, with reference to FIG. 1h, the superficial amorphous layer 9 will recrystallize from the thin layer 6 which acts as seed layer. When this recrystallization annealing is performed, the roughness of the thin layer 6 is substantially reduced, for example a reduction of the roughness of about 20%, and a thickness of material of good crystalline quality is reformed instead of and in place of the damaged zone.

This recrystallization annealing consists in this embodiment of low-temperature annealing performed at a temperature comprised between 500° and 1000° C. for a few seconds to 2 hours in an inert atmosphere, i.e. in a non-oxidative atmosphere.

It should be noted that the duration and temperature of this recrystallization annealing will depend on the thickness of the amorphous layer 9.

With reference to FIG. 1i, the method comprises a step of removing the crystalline defects 10 liable to form in the thin layer 6 when recrystallization of the amorphous layer 9 takes place at the level of the interface between the crystalline layer of the thin layer 6 and the amorphous layer 9.

This step of removing the crystalline defects 10 consists in performing annealing at a temperature of more than 1000° C. for a few seconds to several hours.

It can be observed that this annealing also enables the residual roughness of the upper surface of the thin layer 6 to be reduced to within acceptable ranges, for example the roughness to be reduced to a value of less than 5 A RMS.

Example 2

With reference to FIG. 1, the method comprises in the same way as before a formation step of an insulating layer 1 (FIG. 1b) of oxide with a thickness comprised between 500 and 2000 Angstrom on the upper surface of a donor substrate 2 (FIG. 1a) made of Silicon (Si).

With reference to FIG. 1c, hydrogen is then implanted via the upper surface of the insulating layer 1 with a dose of about $5 \times 10^{16}$ at/cm$^2$ and an energy of about 200 keV so as to form a fragilized buried zone 4, represented by broken lines in FIG. 1c, in the donor substrate 2.

This fragilized zone 4 is formed in the donor substrate 2 about 2 microns below the insulating layer 1.

Then, with reference to FIG. 1d, a support substrate 5 is bonded to the upper surface of the insulating layer 1 by any suitable means. Again, molecular bonding is used.

With reference to FIG. 3e, a part of the donor substrate 2 is detached at the level of the fragilized zone 4 according to the SMART-CUT® method by annealing at a temperature comprised between 300° and 600° C. for a few hours and by applying mechanical strains if necessary.

A sacrificial oxidation layer 7 with a thickness of about 200 Angstrom is formed on the thin layer 6 and the sacrificial oxidation layer 7 is then removed by immersion in a hydrofluoric acid chemical bath called HF chemical bath.

The method according to the invention comprises, with reference to FIG. 1g, an Argon (Ar) implantation step with a dose of more than $4 \times 10^{14}$ at/cm$^2$ and an energy of about 200 keV via the upper surface of the thin layer 6 to form a superficial amorphous layer 9 with a thickness comprised between 0.1 and less than 1 microns in the thin layer 6.

With reference to FIG. 1h, the superficial amorphous layer 9 will recrystallize by recrystallization annealing from the thin layer 6 which acts as seed layer. When this recrystallization annealing is performed, the roughness of the thin layer 6 is substantially reduced and a thickness of material of good crystalline quality is reformed instead of and in place of the damaged zone which formed when formation of the thin layer 6 took place.

In this example, recrystallization annealing consists of high-temperature annealing performed at a temperature of more than 1000° C. for a few hours in an inert atmosphere, i.e. in a non-oxidative atmosphere, the duration and temperature of this recrystallization annealing depending on the thickness of the amorphous layer 9.

This annealing also has the effect of reducing the roughness of the final thin layer 6 to within an acceptable range, i.e. a value of less than 5 Angstroms RMS.

With reference to FIG. 1i, the method may in the same way as before comprise a step of removing the residual crystalline defects 10 of the thin layer 6 when recrystallization of the amorphous layer 9 takes place.

This step can be polishing of the upper surface of the thin layer 6 or sacrificial oxidation.

The examples set out above illustrate embodiments wherein formation of the thin layer is obtained by detachment at the level of a fragilized zone. However, these examples are not restrictive and it is also possible to achieve such a removal by etching the rear surface of the substrate, after bonding, to remove a controlled thickness therefrom, for example by etching or by polishing, or by any other known form of mechanical and/or chemical etching.

Moreover, it is quite obvious that the method according to the invention may not comprise a deposition step of an insulating oxide layer on the upper surface of the donor substrate or of the thin layer.

Furthermore, the method according to the invention can naturally be applied for fabrication of a semiconductor substrate without an insulating layer or of a substrate obtained in any material usually used in microelectronics, optoelectronics, or micromechanics etc. applications, such as Sapphire for example, without departing from the scope of the invention.

Finally, it is quite obvious that any layer transfer parameters can be envisaged depending in particular on the nature of the implanted species, the implantation energy and the implantation dose, and that the examples described above are in no way restrictive as far as the fields of application of the invention are concerned.

What is claimed is:

1. A method for producing a semiconductor substrate which comprises transferring a thin layer of material from a donor substrate onto a support substrate and then removing a part of the layer of material to form a thin layer on the support substrate, wherein the removing step comprises forming of an amorphous layer in a part of the thin layer, followed by recrystallizing of amorphous layer in order to reduce or eliminate residual roughness on the thin layer, wherein the thin layer is formed by co-implanting at least two different atomic species into the donor substrate to form a fragilized buried zone therein, and then fracturing the fragilized zone to detach the thin layer.

2. The method according to claim 1, which further comprises, prior to forming the amorphous layer, reducing surface roughness on the thin layer.

3. The method according to claim 1, wherein the substrate includes an insulating layer located between the thin layer and the support substrate.

4. The method according to claim 1, wherein the forming of the amorphous layer is achieved by implanting atomic species in the thin layer in such a way that a superficial layer of the thin layer becomes amorphous.

5. The method according to claim 4, wherein the atomic species to be implanted is Si, Ge, Ar, or Xe.

6. The method according to claim 4, wherein the amorphous layer is formed at a thickness of between 0.1 and 2 microns.

7. The method according to claim 4, wherein the species implanted to form the amorphous layer is Ge, Ar or Xe.

8. The method according to claim 1, wherein the recrystallizing of the amorphous layer is obtained by performing a low-temperature annealing.

9. The method according to claim 8, wherein the recrystallizing of the amorphous layer is obtained by performing an annealing at a temperature of between 500 and 800° C. for 3 seconds to 2 hours.

10. The method according to claim 1, wherein one implanted species is hydrogen.

11. The method according to claim 10, wherein one implanted species is helium.

12. The method according to claim 1, wherein one implanted species is helium.

13. The method according to claim 1, wherein the thin layer is formed by implanting ions or gaseous species into the donor substrate to form a fragilized buried zone therein, fracturing the fragilized zone leading to detachment of the thin layer.

14. The method according to claim 1, wherein the thin layer is formed by implanting ions or gaseous species into the donor substrate to form a fragilized buried zone therein, fracturing the fragilized zone leading to detachment of the thin layer.

15. A method for producing a semiconductor substrate which comprises transferring a thin layer of material from a donor substrate onto a support substrate and then removing a part of the layer of material to form a thin layer on the support substrate, wherein the removing step comprises, reducing surface roughness on the thin layer, then forming an amorphous layer in a part of the thin layer, followed by recrystallizing of amorphous layer in order to reduce or eliminate residual roughness on the thin layer, wherein the reducing step includes forming a sacrificial oxidation layer on the thin layer, followed by removing of the oxidation layer.

16. A method for producing a semiconductor substrate which comprises transferring a thin layer of material from a donor substrate onto a support substrate and then removing a part of the layer of material to form a thin layer on the support substrate, wherein the removing step comprises forming an amorphous layer in a part of the thin layer, followed by recrystallizing of amorphous layer in order to reduce or eliminate residual roughness on the thin layer and, after the recrystallizing, removing crystalline defects which are formed during the recrystallizing at an interface between the crystalline layer of the thin layer and the amorphous layer.

17. The method according to claim 16, wherein the removing of the crystalline defects is achieved by performing an annealing at a temperature of more than 1000° C. for a few seconds to several hours.

18. A method for producing a semiconductor substrate which comprises transferring a thin layer of material from a donor substrate onto a support substrate and then removing a part of the layer of material to form a thin layer on the support substrate, wherein the removing step comprises forming an amorphous layer in a part of the thin layer, followed by recrystallizing of amorphous layer in order to reduce or eliminate residual roughness on the thin layer, and then by finishing the surface of the thin layer to eliminate residual surface defects, wherein the finishing includes an annealing.

19. The method according to claim 18, wherein the finishing also includes polishing of the surface of the thin layer.

20. The method according to claim 18, wherein the forming of the thin layer is achieved by providing a porous layer on the donor substrate, depositing by epitaxy a crystalline layer of a semiconductor material on the porous layer, fracturing the porous layer to detach the crystalline layer as the thin layer.

* * * * *